United States Patent
Kim et al.

(10) Patent No.: US 10,020,354 B2
(45) Date of Patent: Jul. 10, 2018

(54) ORGANIC LIGHT-EMITTING DIODE DISPLAYS WITH SILICON AND SEMICONDUCTING OXIDE THIN-FILM TRANSISTORS

(71) Applicant: Apple Inc., Cupertino, CA (US)

(72) Inventors: Jungbae Kim, San Jose, CA (US); Kyung Wook Kim, Cupertino, CA (US); MinKyu Kim, Cupertino, CA (US); Shih Chang Chang, Cupertino, CA (US); Young Bae Park, San Jose, CA (US); Jae Won Choi, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 183 days.

(21) Appl. No.: 14/854,367

(22) Filed: Sep. 15, 2015

(65) Prior Publication Data
US 2016/0307988 A1    Oct. 20, 2016

Related U.S. Application Data

(60) Provisional application No. 62/149,224, filed on Apr. 17, 2015.

(51) Int. Cl.
*H01L 27/32* (2006.01)

(52) U.S. Cl.
CPC ...... *H01L 27/3265* (2013.01); *H01L 27/3262* (2013.01); *H01L 27/3248* (2013.01)

(58) Field of Classification Search
CPC ............. H01L 27/3256; H01L 27/3262; H01L 27/3265
See application file for complete search history.

(56) References Cited

U.S. PATENT DOCUMENTS

| | | |
|---|---|---|
| 8,470,623 B2 | 6/2013 | Kim et al. |
| 8,686,426 B2 | 4/2014 | Ahn et al. |
| 8,969,872 B2 | 3/2015 | Ahn et al. |
| 9,129,927 B2 | 9/2015 | Gupta et al. |
| 9,147,719 B2 | 9/2015 | Kim et al. |
| 2010/0182223 A1* | 7/2010 | Choi .................... G09G 3/3233 345/76 |
| 2013/0214279 A1* | 8/2013 | Nishimura .......... G02F 1/13338 257/59 |

(Continued)

*Primary Examiner* — Lex Malsawma
*Assistant Examiner* — Xia Cross
(74) *Attorney, Agent, or Firm* — Treyz Law Group, P.C.; Jason Tsai

(57) ABSTRACT

An electronic device may include a display having an array of display pixels on a substrate. The display pixels may be organic light-emitting diode display pixels or display pixels in a liquid crystal display. In an organic light-emitting diode display, hybrid thin-film transistor structures may be formed that include semiconducting oxide thin-film transistors, silicon thin-film transistors, and capacitor structures. The capacitor structures may overlap the semiconducting oxide thin-film transistors. The silicon transistors may be configured in a top gate arrangement. The oxide transistors may be configured in a top gate or a bottom gate arrangement. In one embodiment, source-drain contacts for the silicon and oxide transistors may be formed simultaneously. In another embodiment, the silicon and oxide thin-film transistor structures may be formed using at least three metal routing layers.

4 Claims, 8 Drawing Sheets

(56) References Cited

U.S. PATENT DOCUMENTS

| | | | | |
|---|---|---|---|---|
| 2014/0353619 A1* | 12/2014 | Park | ................... | H01L 27/3276 257/40 |
| 2015/0123084 A1* | 5/2015 | Kim | ..................... | H01L 27/326 257/40 |
| 2015/0279872 A1* | 10/2015 | Kato | .................. | H01L 27/1255 257/43 |
| 2016/0013212 A1* | 1/2016 | Im | ......................... | H01L 24/05 257/43 |

* cited by examiner

ORGANIC LIGHT-EMITTING DIODE DISPLAYS WITH SILICON AND SEMICONDUCTING OXIDE THIN-FILM TRANSISTORS

This application claims the benefit of provisional patent application No. 62/149,224 filed on Apr. 17, 2015, which is hereby incorporated by reference herein in its entirety.

BACKGROUND

This relates generally to electronic devices and, more particularly, to electronic devices with displays that have thin-film transistors.

Electronic devices often include displays. For example, cellular telephones and portable computers include displays for presenting information to users.

Displays such as organic light-emitting diode displays have an array of display pixels based on light-emitting diodes. In this type of display, each display pixel includes a light-emitting diode and thin-film transistors for controlling application of a signal to the light-emitting diode.

Thin-film display driver circuitry is often included in displays. For example, gate driver circuitry and demultiplexer circuitry on a display may be formed from thin-film transistors.

If care is not taken, thin-film transistor circuitry in the display pixels and display driver circuitry of a display may exhibit non-uniformity, excessive leakage currents, insufficient drive strengths, poor area efficiency, hysteresis, and other issues. It would therefore be desirable to be able to provide improved electronic device displays.

SUMMARY

An electronic device may be provided with a display. The display may have an array of display pixels on a substrate. The display pixels may be organic light-emitting diode display pixels or display pixels in a liquid crystal display.

In accordance with an embodiment, organic light-emitting diode display circuitry is provided that includes a silicon thin-film transistor, a top gate semiconducting oxide thin-film transistor that is coupled to the silicon thin-film transistor and that includes a gate conductor formed in a given metal layer, and a capacitor that is coupled to the silicon thin-film transistor and that includes an electrode formed as part of the given metal layer in which the gate conductor of the top gate semiconducting oxide thin-film transistor is formed. The silicon thin-film transistor may include source-drain contacts formed as part of the given metal layer. The top gate semiconducting oxide transistor may also include source-drain contacts that are coupled to the semiconducting oxide layer and that are formed in a first additional metal layer that is different than the given metal layer. The capacitor may also include another electrode formed as part of the first additional metal layer. The silicon thin-film transistor may also include a gate conductor formed as part of a second additional metal layer that is different than the given metal and the first additional metal layer.

A buffer layer formed be formed over a display substrate. The silicon thin-film transistor may further include an active silicon layer that is formed directly on the buffer layer, where another silicon layer that is separate from the active silicon layer may be formed directly on the buffer layer, and where the another silicon layer may be coupled to a power supply line that is formed as part of the given metal layer. If desired, an additional capacitor may be formed that includes a first electrode formed directly on the buffer layer and a second electrode formed as part of the second additional metal layer.

In accordance with another embodiment, an organic light-emitting diode display may be provided that includes a substrate and a silicon transistor formed over the substrate, where the silicon transistor includes a gate conductor and an active silicon region that are separated by a gate insulating layer. The display may also include a semiconducting oxide transistor that includes an active semiconducting oxide layer that is directly on the gate insulating layer.

A dielectric layer may be formed over the silicon transistor and the semiconducting oxide transistor. First source-drain contacts may be formed through the dielectric layer that make contact with the active silicon region. Second source-drain contacts may be formed through the dielectric layer that make contact with the active semiconducting oxide layer. As an example, the dielectric layer may include a silicon nitride layer and a silicon oxide layer that is formed over the silicon nitride layer. As another example, the dielectric layer may include a silicon oxide layer and a silicon nitride layer that is formed over the silicon oxide layer. The semiconducting oxide transistor may further include a gate conductor that is formed over the active semiconducting oxide layer.

In accordance with yet another suitable embodiment, an organic light-emitting diode display is provided that includes a substrate, a silicon thin-film transistor formed over the substrate, where the silicon thin-film transistor includes a gate conductor. A dielectric layer may be formed over the gate conductor of the silicon thin-film transistor. The dielectric layer may include only one silicon nitride layer. The display may also include a bottom gate semiconducting oxide thin-film transistor having a gate conductor that is formed directly on the dielectric layer.

The gate conductor of the silicon thin-film transistor may be formed in a first metal layer, and the gate conductor of the bottom gate semiconducting oxide thin-film transistor may be formed in a second metal layer that is different than the first metal layer. The display may also include a capacitor having a first plate formed in the first metal layer and a second plate formed in the second metal layer.

The bottom gate semiconductor oxide thin-film transistor may further include an active semiconducting oxide layer that is formed above its gate conductor. The bottom gate semiconductor oxide thin-film transistor further includes source-drain contacts that are formed directly on opposing sides of the active semiconducting oxide layer and that are formed in a third metal layer that is different than the first and second metal layers.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

DETAILED DESCRIPTION

Figure 1:
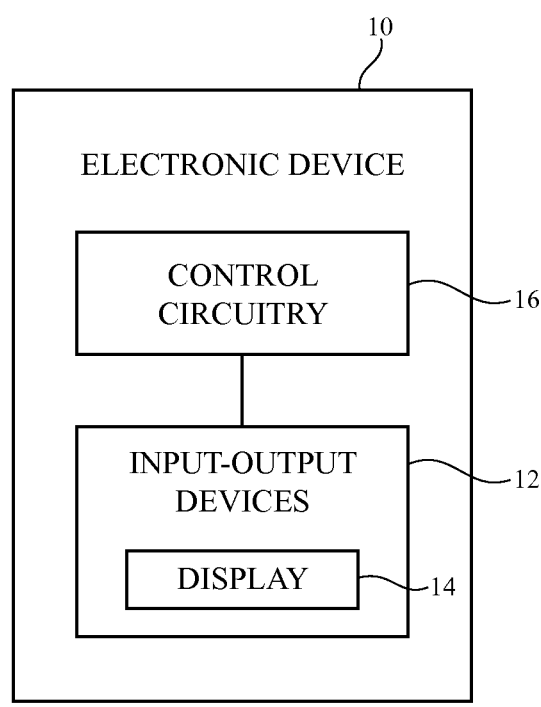
FIG. 1 is a schematic diagram of an illustrative electronic device having a display in accordance with an embodiment.

An illustrative electronic device of the type that may be provided with a display is shown in FIG. 1. As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, sensors, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Control circuitry 16 may be used to run software on device 10 such as operating system code and applications. During operation of device 10, the software running on control circuitry 16 may display images on display 14 using an array of pixels in display 14.

Device 10 may be a tablet computer, laptop computer, a desktop computer, a display, a cellular telephone, a media player, a wristwatch device or other wearable electronic equipment, or other suitable electronic device.

Display 14 may be an organic light-emitting diode display or may be a display based on other types of display technology. Configurations in which display 14 is an organic light-emitting diode display are sometimes described herein as an example. This is, however, merely illustrative. Any suitable type of display may be used, if desired.

Display 14 may have a rectangular shape (i.e., display 14 may have a rectangular footprint and a rectangular peripheral edge that runs around the rectangular footprint) or may have other suitable shapes. Display 14 may be planar or may have a curved profile.

Figure 2:
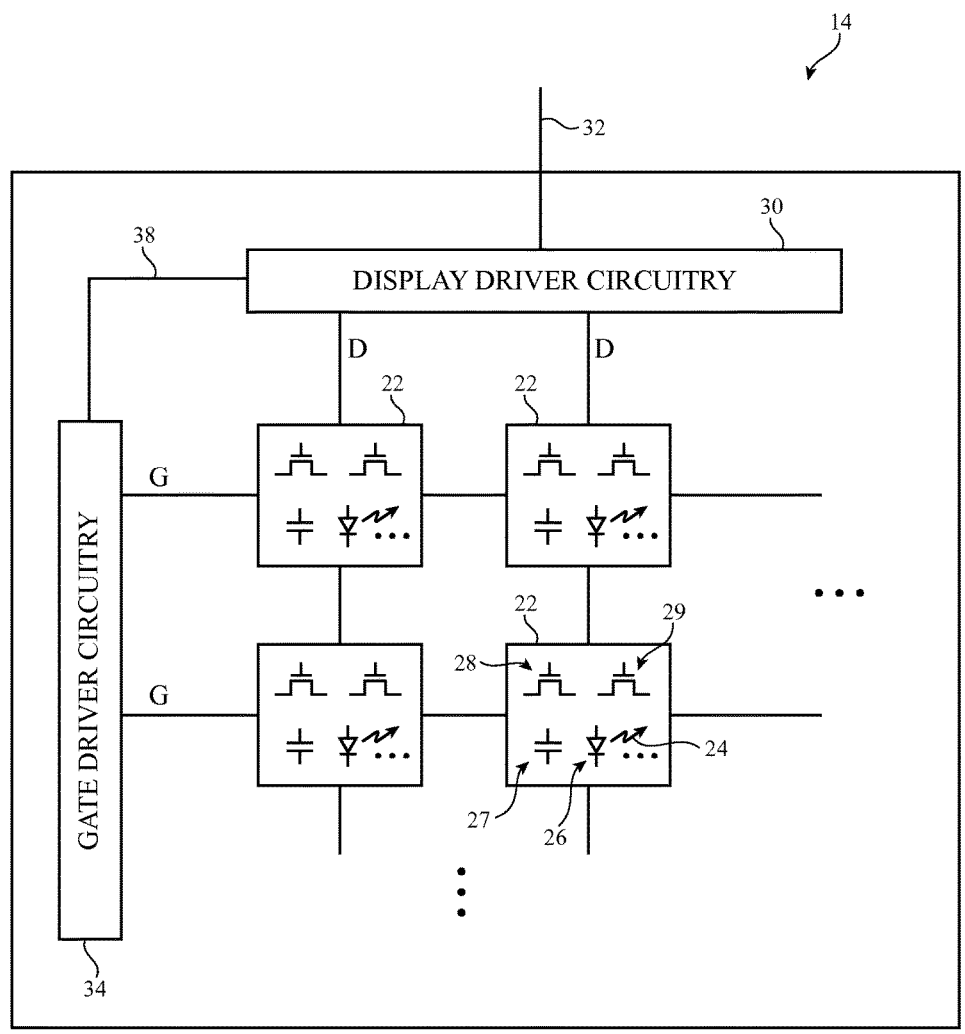
FIG. 2 is a top view of an illustrative display in an electronic device in accordance with an embodiment.

A top view of a portion of display 14 is shown in FIG. 2. As shown in FIG. 2, display 14 may have an array of pixels 22 formed on substrate 36. Substrate 36 may be formed from glass, metal, plastic, ceramic, or other substrate materials. Pixels 22 may receive data signals over signal paths such as data lines D and may receive one or more control signals over control signal paths such as horizontal control lines G (sometimes referred to as gate lines, scan lines, emission control lines, etc.). There may be any suitable number of rows and columns of pixels 22 in display 14 (e.g., tens or more, hundreds or more, or thousands or more). Each pixel 22 may have a light-emitting diode 26 that emits light 24 under the control of a pixel control circuit formed from thin-film transistor circuitry such as thin-film transistors 28 and 29 and thin-film capacitors 27 that are coupled to one another.

With one suitable arrangement, which is sometimes described herein as an example, the channel region (active region) in some thin-film transistors such as transistors 28 on display 14 is formed from silicon (e.g., silicon such as polysilicon deposited using a low temperature process, sometimes referred to as LTPS or low-temperature polysilicon), whereas the channel region in other thin-film transistors such as transistors 29 on display 14 is formed from a semiconducting oxide material (e.g., amorphous indium gallium zinc oxide, sometimes referred to as IGZO). If desired, other types of semiconductors may be used in forming the thin-film transistors such as amorphous silicon, semiconducting oxides other than IGZO, etc.

In a hybrid display configuration of this type, silicon transistors (e.g., LTPS transistors) may be used where attributes such as switching speed and good drive current are desired (e.g., for portions of an organic light-emitting diode display pixel where switching speed is a consideration or for gate drivers in liquid crystal diode displays), whereas oxide transistors (e.g., IGZO transistors) may be used where low leakage current is desired or where high pixel-to-pixel uniformity is desired (e.g., in an array of organic light-emitting diode display pixels). Other considerations may also be taken into account (e.g., considerations related to power consumption, real estate consumption, hysteresis, etc.).

Oxide transistors such as IGZO thin-film transistors are generally n-channel devices (i.e., NMOS transistors). Silicon transistors can be fabricated using p-channel or n-channel designs (i.e., LTPS devices may be either PMOS or NMOS). Combinations of these thin-film transistor structures can provide optimum performance. In general, each pixel 22 may include any number of thin-film transistors and capacitors to support the desired operation. Pixels 22 may contain light-emitting diodes of different colors (e.g., red, green, and blue) to provide display 14 with the ability to display color images.

Display driver circuitry may be used to control the operation of pixels 22. The display driver circuitry may be formed from integrated circuits, thin-film transistor circuits, or other suitable circuitry. Display driver circuitry 30 of FIG. 2 may contain communications circuitry for communicating with system control circuitry such as control circuitry 16 of FIG. 1 over path 32. Path 32 may be formed from traces on a flexible printed circuit or other cable. During operation, the control circuitry (e.g., control circuitry 16 of FIG. 1) may supply circuitry 30 with information on images to be displayed on display 14.

To display the images on display pixels 22, display driver circuitry 30 may supply image data to data lines D while issuing clock signals and other control signals to supporting display driver circuitry such as gate driver circuitry 34 over path 38. If desired, circuitry 30 may also supply clock signals and other control signals to gate driver circuitry on an opposing edge of display 14.

Gate driver circuitry 34 (sometimes referred to as horizontal control line control circuitry) may be implemented as part of an integrated circuit and/or may be implemented using thin-film transistor circuitry. Horizontal control lines G in display 14 may carry gate line signals (scan line signals), emission enable control signals, and other horizontal control signals for controlling the pixels of each row. There may be any suitable number of horizontal control signals per row of pixels 22 (e.g., one or more, two or more, three or more, four or more, etc.).

Figure 3:
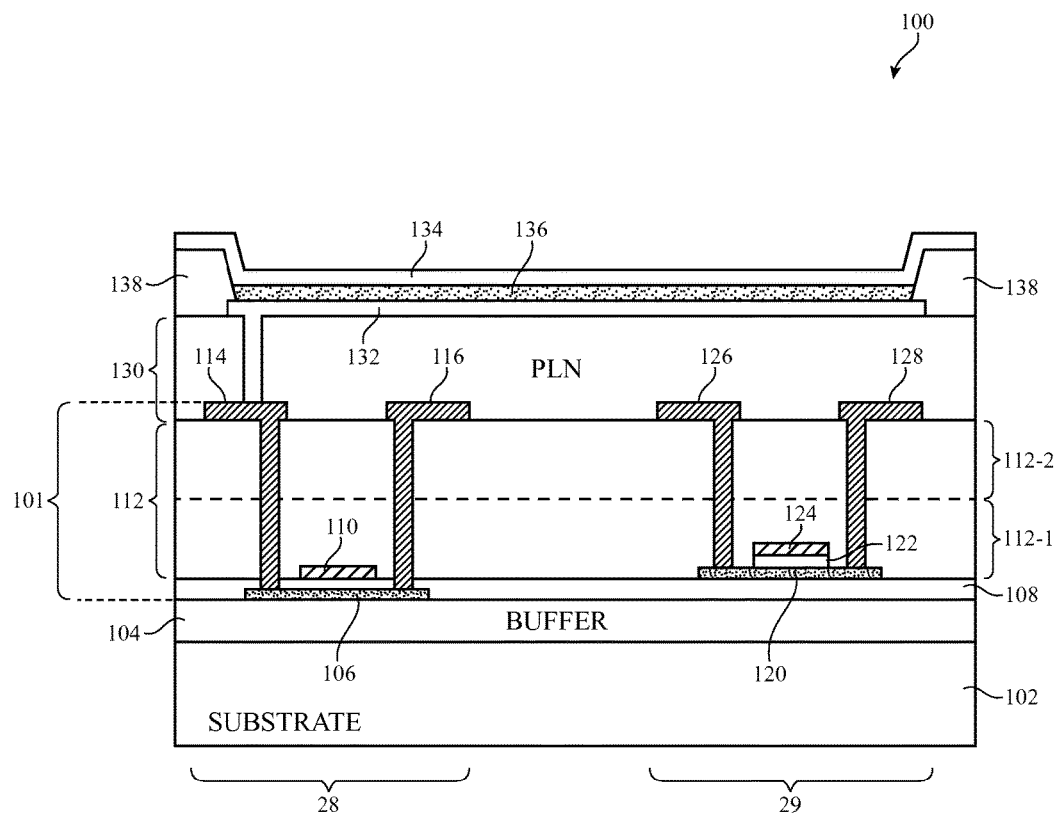
FIG. 3 is a cross-sectional side view of an illustrative organic light-emitting diode display pixel of the type that may include silicon and oxide thin-film transistors in accordance with an embodiment.

Organic light-emitting diode display pixels such as pixel 22 of FIG. 2 may use thin-film transistor structures of the type shown in FIG. 3. In this type of structure, two different types of semiconductor are used. As shown in FIG. 3, display circuitry 100 may include display pixel structures such as light-emitting diode cathode terminal 134 and light-emitting diode anode terminal 132. Organic light-emitting diode emissive material 136 may be interposed between cathode 134 and anode 132. Dielectric layer 138 may serve to define the layout of the display pixel and may sometimes be referred to as a pixel definition layer. Planarization layer 130 may be formed on top of thin-film transistor structures 101. Thin-film transistor structures 101 may be formed on buffer layer 104 on substrate 102. Substrate 102 may be formed from glass, metal, plastic, ceramic, rigid material formed from some combination of these materials, flexible material formed from some combination of these materials, or other substrate materials. Buffer layer 104 may include one or more inorganic buffer layers such as layers of silicon oxide, silicon nitride, etc. In certain embodiments, light shielding structures may also be formed within buffer layer(s) 104.

Thin-film transistor structures 101 may include silicon transistor 28. Transistor 28 may be an LTPS transistor formed using a "top gate" design. Transistor 28 may have a polysilicon channel 106 that is covered by gate insulator layer 108 (e.g., a layer of silicon oxide). Gate conductor 110 may be formed from patterned metal (e.g., molybdenum, as an example). Gate 110 may be covered by one or more layers 112 of interlayer dielectric (e.g., "ILD" layers 112-1 and 112-2). As an example, layer 112-1 may be a silicon nitride layer while layer 112-2 is a silicon oxide layer. As another example, layer 112-1 may be a silicon oxide layer while layer 112-2 is a silicon nitride layer. Typically, a high-temperature annealing process is performed after deposition of the silicon nitride layer, so the order of layers 112-1 and 112-2 may be chosen such that the high-temperature annealing process does not negatively impact the performance of transistors 28 and/or 29. Source-drain contacts 114 and 116 may contact opposing sides of the polysilicon layer 106 to form the silicon thin-film transistor 28. Polysilicon layer 106 serving as a channel region surrounded by source-drain regions may sometimes be referred to as the "active" semiconductor region.

Thin-film transistor structures 101 may also include thin-film transistor 29. Transistor 29 may be an oxide transistor formed also using a top gate design. Transistor 29 may have a semiconducting oxide channel 120 (e.g., a layer of IGZO) that is formed directly on gate insulator layer 108 and that is covered by another gate insulating liner 122. Formed in this way, gate conductor 110 of transistor 28 and the oxide layer 120 of transistor 29 may be formed on the same planar (e.g., the gate of the polysilicon transistor and the active material of the oxide transistor may be coplanar). Gate conductor 124 may be formed from patterned metal. Gate conductor 124 may be formed at the same time as gate 110 or may be formed at different times. Gate 124 may also be covered by layers 112 (e.g., layers 112-1 and 112-2). Source-drain contacts 126 and 128 may contact opposing sides of the oxide layer 120 to form the oxide thin-film transistor 29. Semiconducting oxide layer 120 serving as a channel region surrounded by source-drain regions may also sometimes be referred to as the "active" semiconductor region.

Transistors such as polysilicon transistors (e.g., LTPS transistors) and oxide transistors (e.g., IGZO transistors) may be formed with different layouts. For example, polysilicon transistors tend to have high carrier mobilities. As a result, polysilicon transistors may have relatively long gate lengths L and relatively short gate widths to ensure appropriately low ratios of W/L to compensate for the relatively high mobility of these transistors. This may cause polysilicon transistors to be relatively inefficient for pixel layout. Oxide transistors may be constructed with W/L ratios with smaller aspect ratios (e.g., 4/4 for oxide relative to 3/30 for LTPS). In display pixels with more transistors (e.g., three or more, four or more, five or more, six or more, seven or more, or eight or more), the selection of which transistors are implemented using LTPS technology and which transistors are implemented using oxide technology may be made so as to balance transistor performance considerations between the two types of transistors.

The embodiment of FIG. 3 may be advantageous since the source-drain contacts for both the silicon and oxide transistors extend from the top of ILD layer(s) 112 to near the bottom of ILD layer(s) 112. As a result, the source-drain contacts for both types of transistors 28 and 29 may be formed at the same time (e.g., contacts 114, 116, 126, and 128 may be formed in parallel using the same processing steps). Other configurations that do not allow source-drain contacts for different types of transistors to be formed simultaneously requires use of additional masks for separately patterning the source-drain contacts for each of the different types of thin-film transistors, thereby increasing manufacturing cost.

Figure 4:
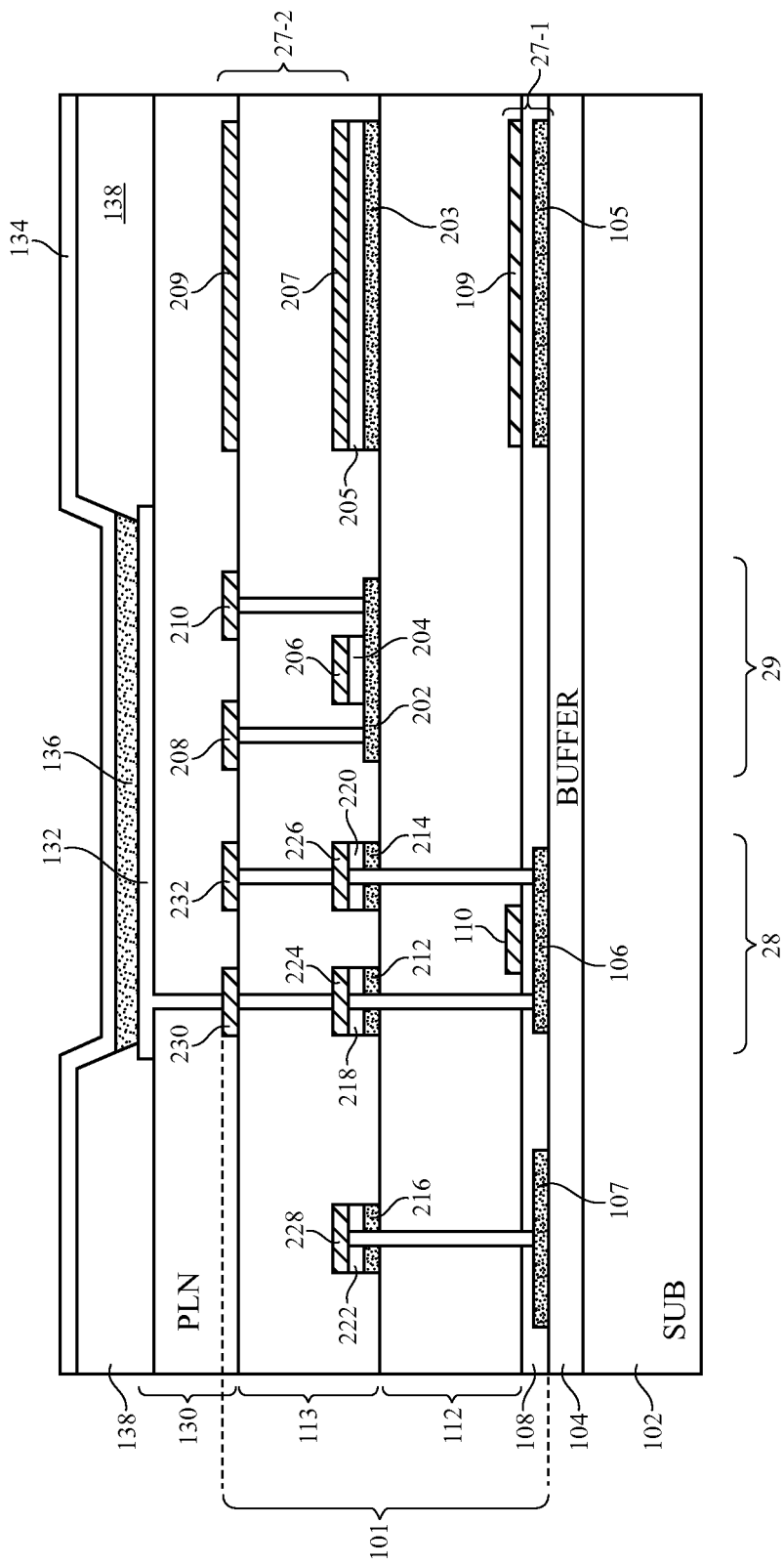
FIG. 4 is a cross-sectional side view of an illustrative organic light-emitting diode display pixel that includes silicon and oxide thin-film transistors with gate conductors formed from different metal layers in accordance with an embodiment.

The example of FIG. 3 in which TFT structures 101 are formed using two metal layers (e.g., a first metal layer for patterning the gate 110 for transistor 28 and gate 124 for transistor 29 and a second metal layer for patterning the source-drain contacts 114, 116, 126, and 128) is merely illustrative and does not limit the scope of the present invention. FIG. 4 shows another suitable arrangement in which the thin-film transistor structures 101 are formed using three metal layers. As shown in FIG. 4, an additional ILD layer 113 (e.g., a silicon nitride layer or other dielectric layer) may be interposed between ILD layer 112 and planarization layer 130.

Active semiconducting oxide layer 202 of transistor 29 may now be formed on layer 112 within additional ILD layer 113. Gate insulating layer 204 may be formed on oxide layer 202. Gate conductor 206 may be formed on oxide layer 202. Gate 206 and oxide layer 202 may be covered by layer 113. Source-drain contacts 208 and 210 may be formed through layer 113 to contact opposing sides of oxide layer 202 to form the oxide thin-film transistor 29. Formed in this way, gate 110 of silicon transistor 28 may be patterned using a first metal layer M1, gate 206 of oxide transistor 29 may be patterned using a second metal layer M2, and source-drain contacts 208 and 210 may be patterned using a third metal layer M3.

Silicon transistor 28, which has its active silicon layer 106 formed below ILD layer 112, may now have source-drain contacts formed using the M2 and M3 metal layers. As shown in FIG. 4, transistor 28 may have a first M2 source-drain contact 224 (which is formed over gate insulating layer 218 and semiconducting oxide layer 212) and a second M2 source-drain contact 226 (which is formed over gate insulating layer 220 and semiconducting oxide layer 214). Transistor 28 may also have a first M3 source-drain contact 230 that is coupled to the first M2 source-drain contact 224 and a second M3 source-drain contact 232 that is coupled to the second M2 source-drain contact 226. Configured in this way, active oxide material 202, 212, and 214 may be formed at the same time; gate insulating layer 204, 218, and 220 may be formed at the same time; and conductors 206, 224, and 226 may be patterned during the same time.

As described above in connection with FIG. 2, display pixels 22 may generally include one or more capacitors. FIG. 4 shows how thin-film capacitor structures 27 may also be formed in addition to the thin-film transistors 28 and 29. For example, a first capacitor 27-1 may have a first terminal (sometimes referred to as a plate, electrode, or electrode layer) that is formed from polysilicon layer 105 (patterned as part of the same layer as layer 106) and a second terminal that is formed from conductor 109 in the M1 metal layer (patterned as part of the same layer as gate 110). Capacitor 27-1 formed in this way may, for example, be suitable for implementing capacitance between the gate terminal and the source terminal for an LTPS transistor. If desired, capacitor 27-1 may be formed directly underneath transistor 29 to save die area (e.g., capacitor 27-1 may at least partially overlap with transistor 29 to reduce total footprint).

TFT circuitry 101 may also be provided with a second capacitor 27-2 that includes a first terminal formed from plate 207 in the M2 metal layer (patterned as part of the same layer as gate 206 and source-drain contacts 224 and 226) and a second terminal formed from plate 209 in the M3 metal layer (patterned as part of the same layer as contacts 208 and 210). Plate 207 may be formed over insulating layer 205 (which is patterned at the same time as gate insulating layer 204) and semiconducting oxide layer 203 (which is patterned at the same time as channel layer 202). Since the first terminal of capacitor 27-2 is formed in the same layer as source-drain contacts 224 and 226 of silicon transistor 28, capacitor 27-2 of this type may be suitable for implementing capacitance between the drain terminal and the source terminal of a polysilicon transistor (as an example). As another example, since the first terminal of capacitor 27-2 is also formed in the same layer as gate 206 of oxide transistor 29, capacitor 27-2 may also be used for implementing capacitance between a gate terminal and a source-drain terminal of an IGZO transistor.

The inclusion of an additional metal routing layer in the display stackup can also facilitate the routing of power supply signal (e.g., a ground power supply voltage or a positive power supply voltage) in a display pixel. As shown in the example of FIG. 4, a transistor source terminal layer 107 may be coupled to a ground power supply line 228 in the M2 metal layer instead of the anode layer. The M2 power supply line contact 228 may be formed over insulating layer 222 (which may be formed at the same time as layer 204) and semiconducting oxide layer 216 (which may be formed at the same time as layer 202). Freeing up area in the anode layer can help increase the aperture ratio of the display pixel.

Figure 5:
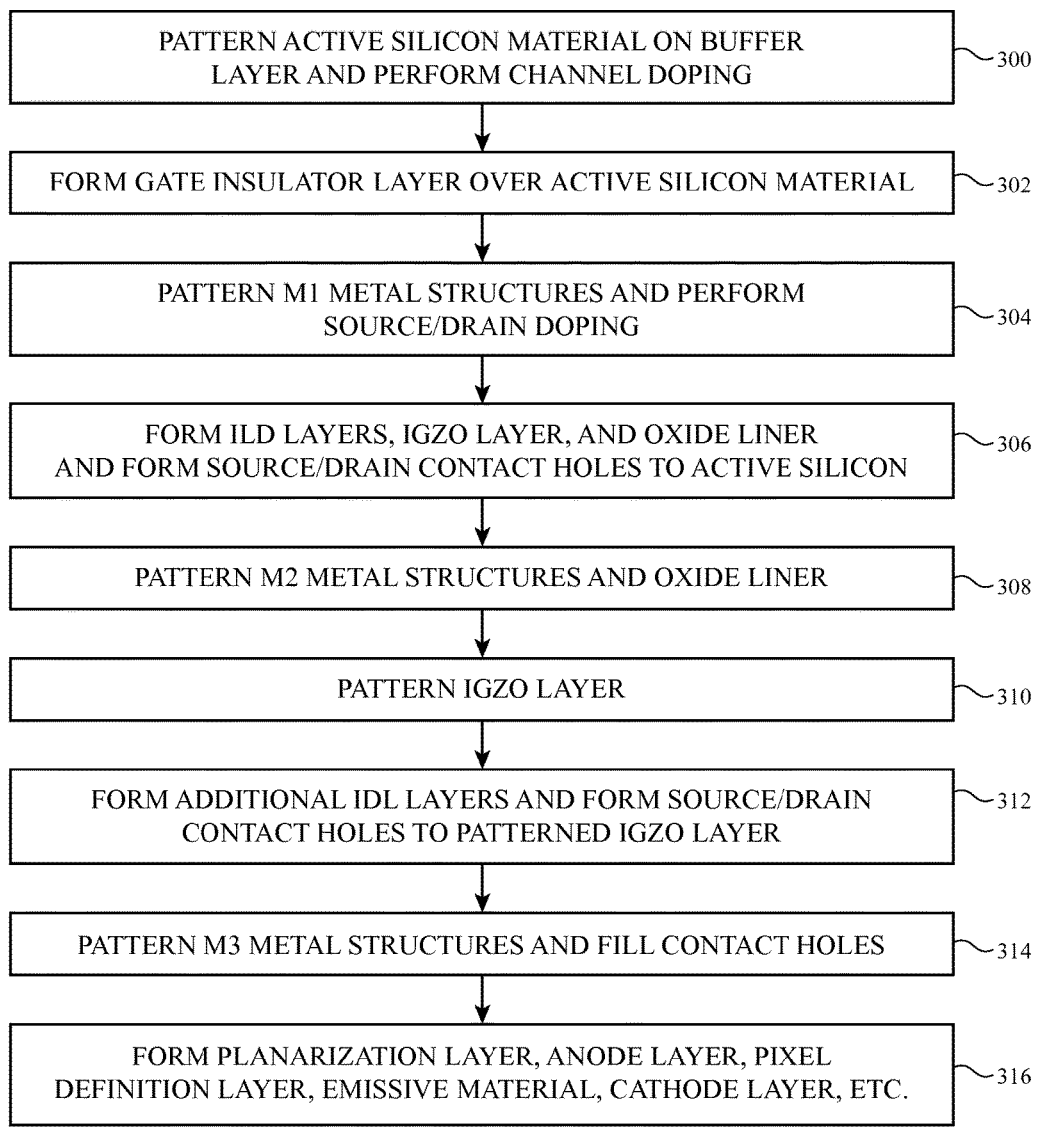
FIG. 5 is a flow chart of illustrative steps for fabricating a display pixel of the type shown in FIG. 4 in accordance with an embodiment.

FIG. 5 is a flow chart of illustrative steps for fabricating a display pixel of the type shown in FIG. 4 in accordance with an embodiment. At step 300, active silicon material (e.g., to form a channel region for an LTPS transistor, to form a first electrode for capacitor 27-1, or to form a source contact region for power supply contact 228) may be patterned on buffer layer 104. Dopants such as n-type dopants may then be implanted to perform the desired channel doping for an n-channel silicon transistor 28 (as an example). If desired, p-type dopants may instead be implanted to form p-channel silicon transistors.

At step 302, gate insulating layer 108 may be formed on the buffer layer over the active silicon material. At step 304, M1 metal structures may then be patterned on the gate insulating layer (e.g., to form a gate conductor for an LTPS transistor, to form a second electrode for capacitor 27-1, etc.). Dopants such as n-type dopants may then be implanted to perform the desired source-drain doping for the silicon transistor.

At step 306, one or more ILD layers 112 may be formed over the M1 metal structures, a blanket semiconducting oxide layer (e.g., an IGZO layer) may be formed on the ILD layer 112, and a blanket gate insulating layer may be formed on the semiconducting oxide layer. Source-drain contact holes may then be formed through the gate insulating layer, the semiconducting oxide layer, ILD layer 112, and gate insulating layer 108 to expose the active source-drain regions of the silicon transistor.

At step 308, M2 metal structures may then be patterned on the blanket gate insulating layer formed during step 306 (e.g., to form gate conductor 206, the M2 source-drain contacts 224 and 226 for the silicon transistor, to form the first electrode for capacitor 27-2, and to form power supply line 228). During this step, the blank gate insulating layer may also be patterned using the patterned M2 metal structures as the masking layer (e.g., so that gate insulating material that is not covered by the patterned M2 layers will be removed).

At step 310, the blanket semiconducting oxide layer may then be separately patterned to form the active region 202 for the oxide transistor. The semiconducting oxide layer associated with the other TFT structures (e.g., layers 203, 212, 214, and 216 in FIG. 4) may be patterned to have the same shape as the corresponding M2 metal structures.

At step 312, one or more additional ILD layers 113 may be formed over the M2 metal structures. Source-drain contact holes may then be formed through the additional ILD layer 113 to expose the active source-drain regions of the oxide transistor (e.g., via holes may be formed that extend down to the source-drain portions of the IGZO layer 202).

At step 314, M3 metal structures may be formed on the additional ILD layer 113 (e.g., to form IGZO transistor source-drain contacts 208 and 210, to form polysilicon transistor source-drain contacts 230 and 232, to form the second electrode of capacitor 27-2, etc.). In particular, the IGZO transistor source-drain contacts 208 and 210 may be formed by filling the via holes etched out during step 312.

At step 316, additional backend organic light-emitting diode (OLED) structures such as the planarization layer, the anode layer, the pixel definition layer, emissive material, the cathode layer, and other passivation layers may be formed over the thin-film transistor structures 101. The steps described in connection with FIG. 5 are merely illustrative. The existing steps may be modified or omitted, additional steps may be added, and the order of certain steps may be altered without departing from the scope of the present invention.

Figure 6:
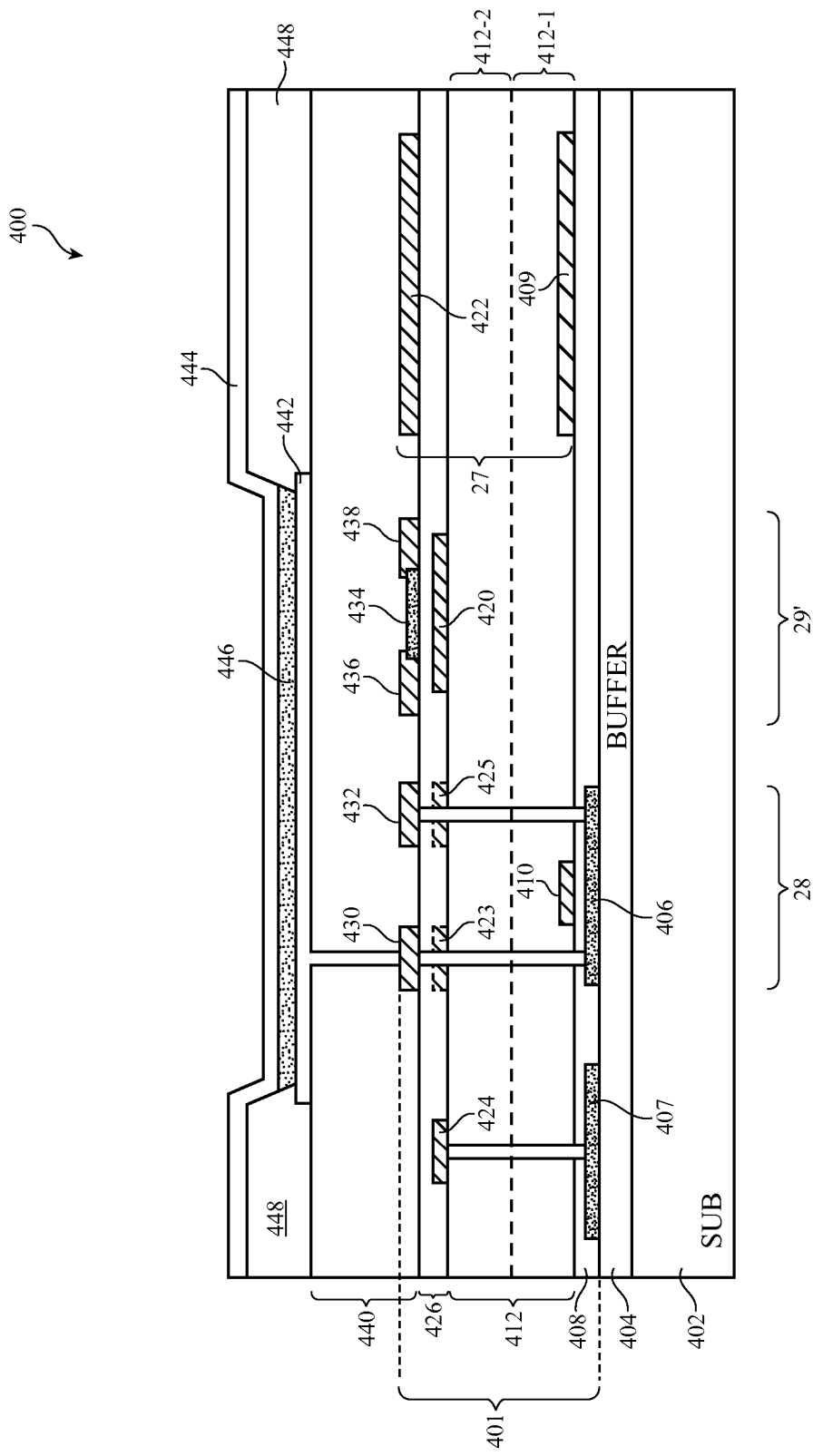
FIGS. 6 and 7 are cross-sectional side views of illustrative organic light-emitting diode display circuitry that includes a top-gate silicon thin-film transistor and a bottom-gate silicon thin-film transistor in accordance with an embodiment.

The embodiments of FIGS. 3-5 relate to hybrid display pixels that include one or more silicon transistors and one or more oxide transistors implemented using the top gate design. FIG. 6 shows another suitable arrangement in which the oxide transistor is implemented using a "bottom gate" design. As shown in FIG. 6, display circuitry 400 may include display pixel structures such as light-emitting diode cathode terminal 444 and light-emitting diode anode terminal 442. Organic light-emitting diode emissive material 446 may be interposed between cathode 444 and anode 442. Dielectric layer 448 may serve to define the layout of the display pixel and may sometimes be referred to as the pixel definition layer. Planarization layer 440 may be formed on top of thin-film transistor structures 401. Thin-film transistor structures 401 may be formed on buffer layer 404 on substrate 402. Substrate 402 may be formed from glass, metal, plastic, ceramic, rigid material formed from some combination of these materials, flexible material formed from some combination of these materials, or other substrate materials. Buffer layer 404 may include one or more inorganic buffer layers such as layers of silicon oxide, silicon nitride, etc. In certain embodiments, light shielding structures may also be formed within buffer layer(s) 404.

Thin-film transistor structures 401 may include silicon transistor 28. Transistor 28 may be an LTPS transistor formed using a "top gate" design. Transistor 28 may have a polysilicon channel 406 that is covered by gate insulator layer 408 (e.g., a layer of silicon oxide). Gate conductor 410 may be formed from patterned metal (e.g., molybdenum, as an example). Gate 410 may be covered by one or more ILD layers 412 (e.g., layers 412-1 and 412-2). As an example, layer 412-1 may be a silicon nitride layer while layer 412-2 is a silicon oxide layer. As another example, layer 412-1 may be a silicon oxide layer while layer 412-2 is a silicon nitride layer.

In accordance with an embodiment, gate 420 may be patterned directly on ILD layer 412 to serve as the gate terminal of bottom gate oxide transistor 29'. Another gate insulating layer such as silicon oxide layer 426 may be formed over gate conductor 420. An active semiconducting oxide layer 434 may be patterned directly on layer 426. Source-drain contacts 430 and 432 may contact opposing sides of the polysilicon layer 406 to form silicon transistor 28 (e.g., an LTPS transistor). Similarly, source-drain contacts 436 and 438 may be formed directly on opposing sides of active oxide layer 434 to form an oxide transistor 29' (e.g., an IGZO transistor). Configured in this way, transistor 29' may have its gate 420 be formed below its channel region 434 and may therefore be referred to as a "bottom gate" transistor.

The TFT structures 401 of FIG. 6 may therefore also be formed using at least three metal layers. For example, gate conductor 410 of transistor 28 may be formed in the M1 metal layer. Gate conductor 420 of transistor 29' may be formed in the M2 metal layer (e.g., a metal routing layer formed within gate insulating layer 426). Source-drain contacts 430, 432, 436 and 438 may be formed in the M3 metal layer (e.g., a metal routing layer formed within planarization layer 440). If desired, transistor 28 may optionally be provided with M2 source-drain contacts 423 and 425 to ease the dry etching process that is used to form the source-drain contact holes.

Still referring to FIG. 6, thin-film capacitor structures 27 may also be formed in addition to the thin-film transistors 28 and 29'. For example, a capacitor 27 may have a first terminal (sometimes referred to as a plate, electrode, or electrode layer) that is formed from an M1 metal electrode layer 409 (patterned as part of the same layer as gate conductor 410) and a second terminal that is formed from an M2 metal electrode layer 422 (patterned as part of the same layer as gate conductor 420). Capacitor 27 formed in this way may, for example, be suitable for implementing capacitance between the gate terminal and a source-drain terminal of silicon transistor 28.

The inclusion of the additional metal routing layer in the display stackup can also facilitate the routing of power supply signal (e.g., a ground power supply voltage or a positive power supply voltage) in a display pixel. As shown in the example of FIG. 6, a transistor source terminal layer 407 may be coupled to a ground power supply line 424 in the M2 metal layer instead of the anode layer. The M2 power supply line contact 424 may be formed as part of the same layer as gate conductor 420. Freeing up area in the anode layer can help increase the aperture ratio of the display pixel.

Figure 7:
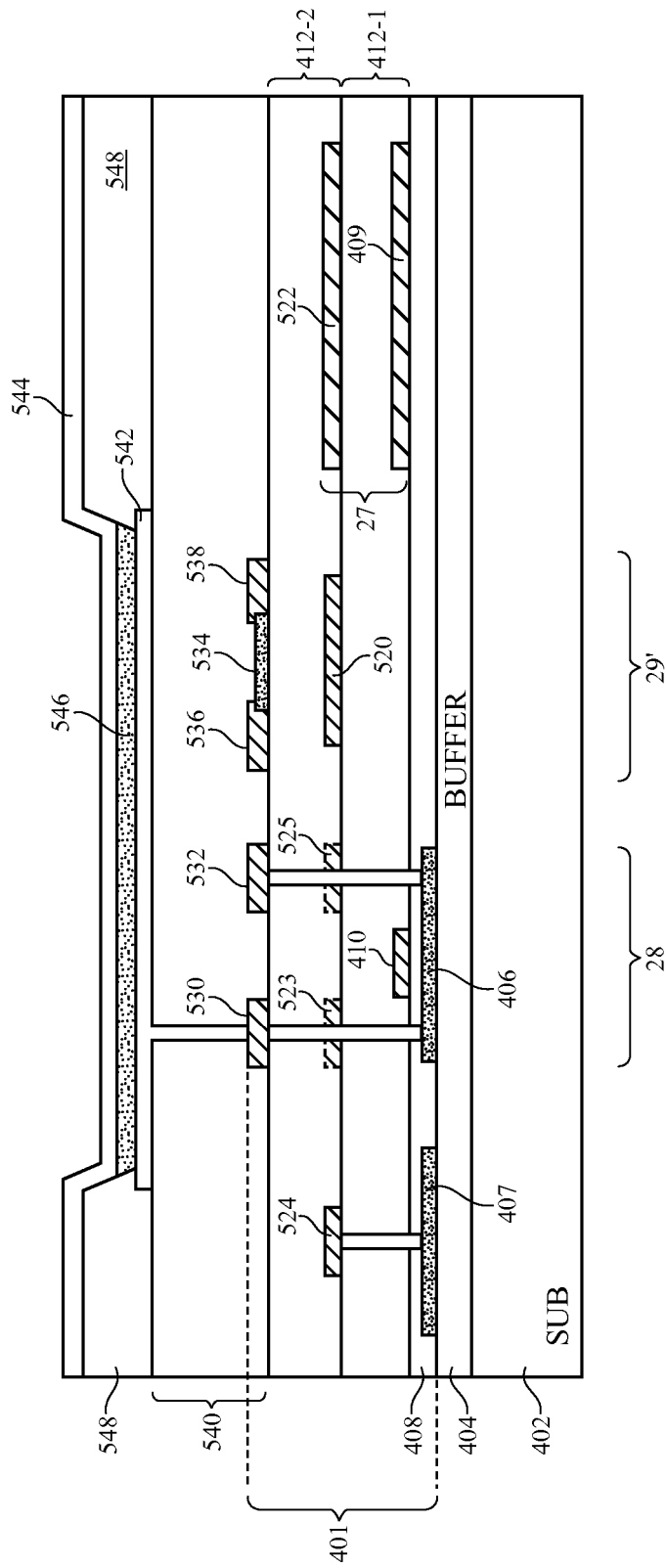

In the example of FIG. 6, the two electrodes of capacitor 27 are separated by two ILD layers 412-1 and 412-2. This can limit the capacitance of capacitor 27 since the distance separating the top and bottom electrodes of capacitor 27 is directly constrained by the thickness of layers 412. FIG. 7 shows another suitable embodiment in which the M2 metal structures are formed in ILD layer 412-2. As shown in FIG. 7, the second electrode 522 of capacitor 27 may now be formed directly on silicon nitride layer 412-1 (as an example). Similarly, the other M2 structures such as the gate conductor 520 of oxide transistor 29', the optional M2 source-drain contacts 523 and 525 of silicon transistor 28, and the M2 power supply line contact 524 may all be formed at the same time as capacitor electrode 522.

By reducing the distance between the top and bottom electrodes of capacitor 27 in this way, the capacitance of capacitor 27 can be increased. Since the contact holes extending from the M3 source-drain contacts 530 and 532 down to the active silicon region 406 are also shorter, the ILD contact hole dry etching time can also be reduced. Moreover, the thickness of ILD layer 412-2 (which now serves as the gate insulating layer for transistor 29') may be controlled to tune and/or improve the performance and stability of the bottom gate oxide transistor 29'. The total stack height of the embodiment of FIG. 7 may be less than that of FIG. 6.

Figure 8:
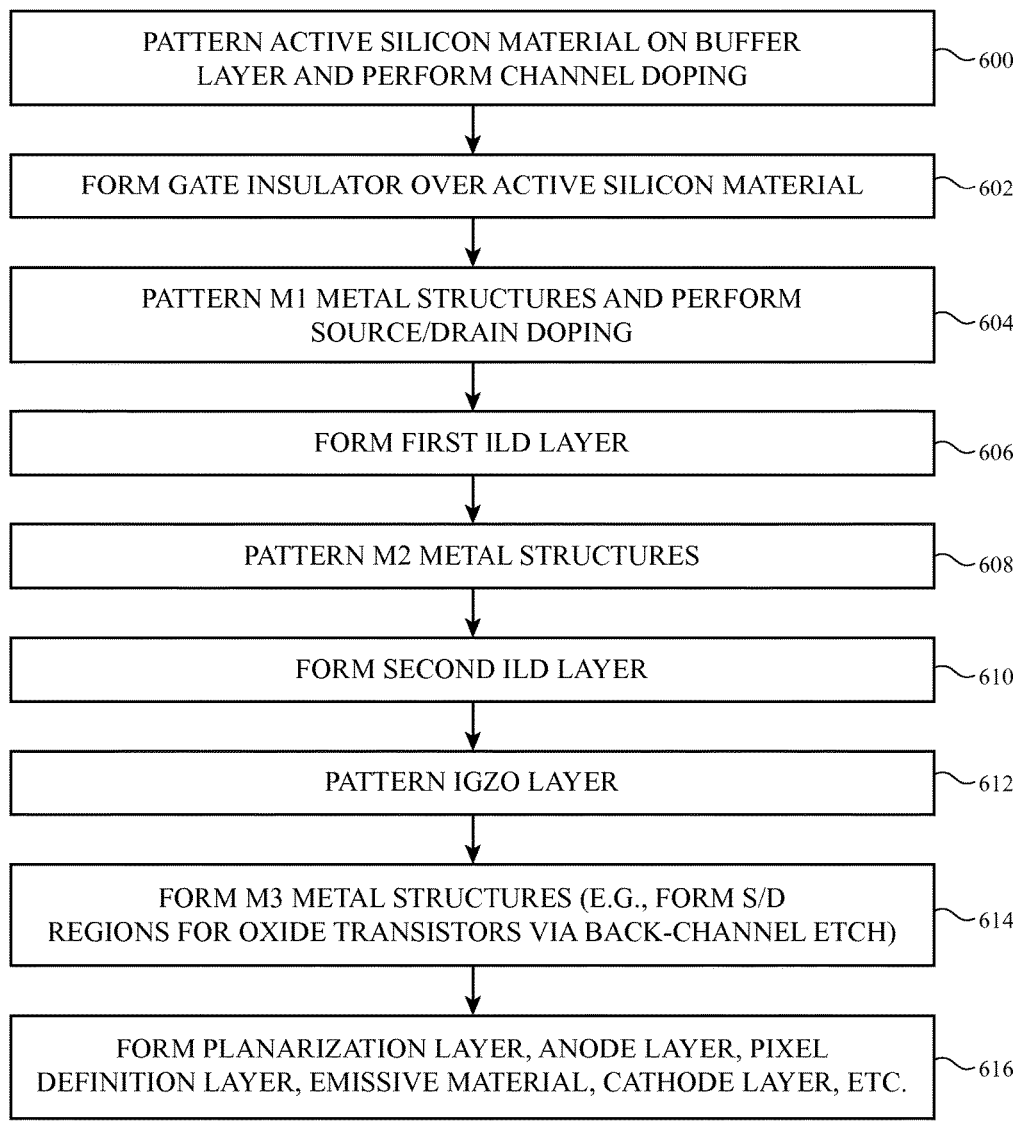
FIG. 8 is a flow chart of illustrative steps for fabricating a display pixel of the type shown in FIG. 7 in accordance with an embodiment.

FIG. 8 is a flow chart of illustrative steps for fabricating a display pixel of the type shown in FIG. 7 in accordance with an embodiment. At step 600, active silicon material (e.g., to form a channel region 406 for an LTPS transistor or to form a source contact region 407 for power supply contact 524) may be patterned on buffer layer 404. Dopants such as n-type dopants may then be implanted to perform the desired channel doping for an n-channel silicon transistor 28 (as an example). If desired, p-type dopants may instead be implanted to form p-channel silicon transistors.

At step 602, gate insulating layer 408 may be formed on the buffer layer over the active silicon material. At step 604, M1 metal structures may then be patterned on the gate insulating layer (e.g., to form a gate conductor for an LTPS transistor, to form a first electrode for capacitor 27, etc.). Dopants such as n-type dopants may then be implanted to perform the desired source-drain doping for the silicon transistor.

At step 606, a first ILD layer 412-1 (e.g., a silicon nitride layer) may be formed over the M1 metal structures. At step 608, M2 metal structures may then be patterned on the first ILD layer 412-1 (e.g., to form gate conductor 520, the M2 source-drain contacts 523 and 525 for silicon transistor, to form the second electrode for capacitor 27, to form power supply line 524, etc.). At step 610, a second ILD layer 412-2 (e.g., a silicon oxide layer) may be formed over the M2 metal structures.

At step 612, active semiconducting oxide material (e.g., to form a channel region 534 for an IGZO transistor) may be patterned on the second ILD layer 412-2. At step 614, M3 metal structures may be formed on the second ILD layer 412-2 (e.g., to form IGZO transistor source-drain contacts 536 and 538 via a back-channel etching process, to form polysilicon transistor source-drain contacts 530 and 532, etc.). Thin-film transistor structures formed by removing a portion of the M3 metal layer from the back surface of IGZO channel region 534 to form separate source-drain contacts 536 and 538 may therefore sometimes be referred to as back-channel etched (BCE) oxide TFT circuitry.

At step 616, additional backend organic light-emitting diode (OLED) structures such as the planarization layer, the anode layer, the pixel definition layer, emissive material, the cathode layer, and other passivation layers may be formed over the thin-film transistor structures 401. The steps described in connection with FIG. 8 are merely illustrative. The existing steps may be modified or omitted, additional steps may be added, and the order of certain steps may be altered without departing from the scope of the present invention.

The foregoing is merely illustrative and various modifications can be made by those skilled in the art without departing from the scope and spirit of the described embodiments. The foregoing embodiments may be implemented individually or in any combination.

What is claimed is:

1. Display circuitry, comprising:
   an organic light-emitting diode having an anode layer and a cathode layer;
   a silicon thin-film transistor that includes a gate conductor and active silicon, wherein the silicon thin-film transistor is coupled to the organic light-emitting diode;
   a top gate semiconducting oxide thin-film transistor that is coupled to the silicon thin-film transistor, that includes a gate conductor formed in a given metal layer, and that includes a semiconducting oxide layer, wherein the gate conductor of the silicon thin-film transistor is formed under the semiconducting oxide layer;
   a first capacitor that is coupled to the silicon thin-film transistor and that includes an electrode formed in the given metal layer in which the gate conductor of the top gate semiconducting oxide thin-film transistor is formed, wherein the electrode is formed directly above another semiconductor oxide layer;
   a second capacitor that is coupled to the silicon thin-film transistor and that includes a first electrode that is formed in the same layer as the active silicon and a second electrode that is formed in the same layer as the gate conductor of the top gate silicon thin-film transistor, wherein the second capacitor is formed directly underneath the top gate semiconducting oxide thin-film transistor to reduce area; and
   an additional conductive layer that is formed in the same layer as the active silicon and that is coupled to a ground power supply line but not coupled to the anode layer of the organic light-emitting diode, wherein the additional conductive layer does not directly contact the active silicon.

2. The display circuitry defined in claim 1, wherein the silicon thin-film transistor includes source-drain contacts formed as part of the given metal layer.

3. The display circuitry of claim 1, wherein the silicon thin-film transistor has a source terminal coupled to the anode layer of the organic light-emitting diode.

4. The display circuitry of claim 1, wherein the additional conductive layer is formed entirely below the top gate semiconducting oxide thin-film transistor.

* * * * *